United States Patent
Ku et al.

(10) Patent No.: US 7,504,292 B2
(45) Date of Patent: Mar. 17, 2009

(54) SHORT CHANNEL EFFECT ENGINEERING IN MOS DEVICE USING EPITAXIALLY CARBON-DOPED SILICON

(75) Inventors: Keh-Chiang Ku, Sindan (TW);
Pang-Yen Tsai, Jhu-bei (TW);
Chun-Feng Nieh, Baoshan Township (TW); Li-Ting Wang, Taiman (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 119 days.

(21) Appl. No.: 11/633,721

(22) Filed: Dec. 5, 2006

(65) Prior Publication Data
US 2008/0132019 A1   Jun. 5, 2008

(51) Int. Cl.
*H01L 21/00* (2006.01)
*H01L 21/84* (2006.01)
*H01L 21/336* (2006.01)

(52) U.S. Cl. .................. 438/197; 438/44; 438/163; 438/290; 438/383; 257/E21.435; 257/E21.437

(58) Field of Classification Search .......... 257/E21.435, 257/E21.437, E21.461, E21.603
See application file for complete search history.

(56) References Cited

U.S. PATENT DOCUMENTS

| | | | |
|---|---|---|---|
| 7,026,232 B1 * | 4/2006 | Koontz et al. | 438/589 |
| 7,122,435 B2 * | 10/2006 | Chidambaram et al. | 438/303 |
| 7,172,933 B2 * | 2/2007 | Huang et al. | 438/197 |
| 7,429,775 B1 * | 9/2008 | Nayak et al. | 257/369 |
| 2007/0093033 A1 * | 4/2007 | Wang et al. | 438/303 |
| 2007/0132027 A1 * | 6/2007 | Chidambaram | 257/351 |
| 2008/0029831 A1 * | 2/2008 | Chen et al. | 257/408 |
| 2008/0044932 A1 * | 2/2008 | Samoilov et al. | 438/5 |
| 2008/0102588 A1 * | 5/2008 | Lee et al. | 438/305 |

* cited by examiner

*Primary Examiner*—Walter L Lindsay, Jr.
*Assistant Examiner*—Mohsen Ahmadi
(74) *Attorney, Agent, or Firm*—Slater & Matsil, L.L.P.

(57) ABSTRACT

A method for forming a semiconductor structure includes providing a semiconductor substrate, forming a gate stack on the semiconductor substrate, and epitaxially growing a lightly-doped source/drain (LDD) region adjacent the gate stack, wherein carbon is simultaneously doped into the LDD region.

10 Claims, 4 Drawing Sheets

SHORT CHANNEL EFFECT ENGINEERING IN MOS DEVICE USING EPITAXIALLY CARBON-DOPED SILICON

TECHNICAL FIELD

This invention relates generally to integrated circuits, and more particularly to structure and formation methods of MOS devices.

BACKGROUND

Reductions in the size and inherent features of semiconductor devices (e.g., a metal-oxide semiconductor field-effect transistor) have enabled continued improvements in speed, performance, density, and cost per unit function of integrated circuits over the past few decades. In accordance with a design of the metal-oxide-semiconductor (MOS) device and one of the inherent characteristics thereof, modulating the length of a channel region underlying a gate between a source and drain of the transistor alters a resistance associated with the channel region, thereby affecting the performance of the transistor. More specifically, shortening the length of the channel region reduces a source-to-drain resistance of the transistor, which assuming other parameters are maintained relatively constant, may allow an increase in current flow between the source and drain when a sufficient voltage is applied to the gate of the transistor. In addition, junction depths of MOS devices are reduced accordingly.

When the scales of integrated circuits are reduced to 65 nm and below, further reduction of the gate lengths and junction depths becomes increasingly difficult. This is partially because of the diffusion of impurities during annealing processes. Particularly for PMOS devices, lightly-doped source/drain (LDD) regions and source/drain regions comprises p-type impurities such as boron or $BF_2$. Due to the high diffusibility of boron and $BF_2$, impurities easily diffuse-out from originally implanted regions during subsequent annealing steps. In addition, the implantation process has the drawback of having boundaries with a slowly changing impurity concentration, and thus it is difficult to implant impurities only into the desired regions. As a result, the junction depth is further enlarged.

Accordingly, a new method for forming MOS devices with improved short channel characteristics is needed.

SUMMARY OF THE INVENTION

In accordance with one aspect of the present invention, a method for forming a semiconductor structure includes providing a semiconductor substrate; forming a gate stack on the semiconductor substrate; and epitaxially growing a lightly-doped source/drain (LDD) region adjacent the gate stack, wherein carbon is simultaneously doped into the LDD region.

In accordance with another aspect of the present invention, a method of forming a semiconductor structure includes providing a semiconductor substrate; forming a gate stack on the semiconductor substrate, forming a first recess in the semiconductor substrate and adjacent to the gate stack; epitaxially growing a lightly-doped source/drain (LDD) region in the first recess, and simultaneously doping carbon and a first impurity in the LDD region; forming a gate spacer on a sidewall of the gate stack; forming a second recess along a sidewall of the gate spacer, wherein the second recess is spaced apart from an edge of the gate stack further than the first recess therefore epitaxially growing a semiconductor material in the second recess, and simultaneously doping a second impurity of a same conductivity type as the first impurity in the semiconductor material.

In accordance with yet another aspect of the present invention, a method of forming a semiconductor structure includes providing a semiconductor substrate; forming a gate stack on the semiconductor substrate; epitaxially growing a lightly-doped source/drain (LDD) region on the semiconductor substrate adjacent the gate stack, wherein carbon and a first impurity is doped simultaneously with the epitaxial growth; forming a gate spacer on a sidewall of the gate stack; forming a recess along a sidewall of the gate spacer; and epitaxially growing a semiconductor material in the recess, wherein a second impurity of a same conductivity type as the first impurity is doped with epitaxial growth.

The advantageous features of the present invention include reduced diffusion of impurities into channel regions of MOS devices and reduced depth of junctions in LDD regions.

BRIEF DESCRIPTION OF THE DRAWINGS

For a more complete understanding of the present invention, and the advantages thereof reference is now made to the following descriptions taken in conjunction with the accompanying drawings, in which:

FIGS. 1 through 8A are cross-sectional views of intermediate stages in the manufacturing of a PMOS embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a metal-oxide semiconductor (MOS) device is provided. The intermediate stages of manufacturing a preferred embodiment of the present invention are illustrated in FIGS. 1 through 8A. Variations of the preferred embodiments are then discussed. Throughout the various views and illustrative embodiments of the present invention, like reference numbers are used to designate like elements.

Figure 1:
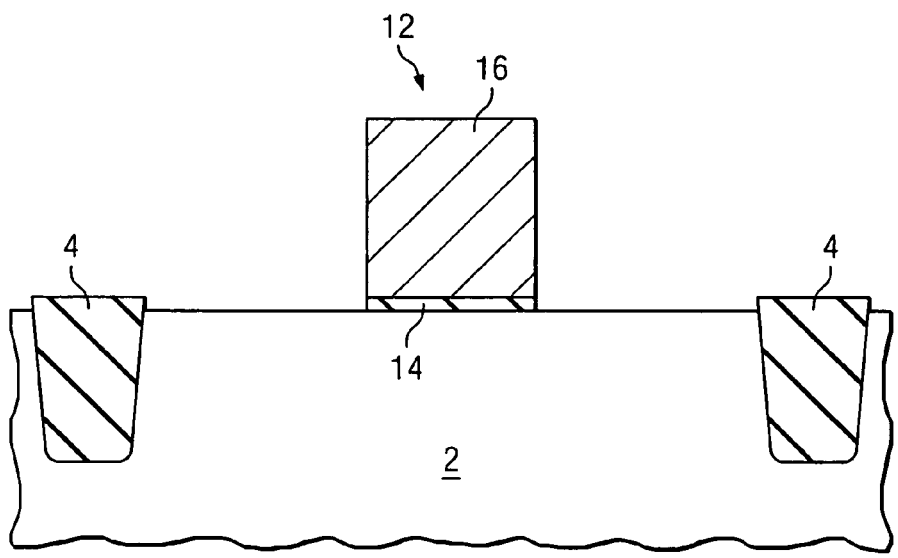

FIG. 1 illustrates a gate stack 12 formed on a substrate 2. Preferably, substrate 2 comprises bulk silicon. Alternatively, substrate 2 comprises bulk SiGe or other semiconductor materials. Substrate 2 may also have a composite structure such as silicon-on-insulator (SOI). Shallow trench isolation (STI) regions 4 are formed in substrate 2 to isolate device regions. As is known in the art, STI regions 4 may be formed by forming recesses in substrate 2 and then filling the recesses with dielectric materials.

Gate stack 12 comprises gate dielectric 14 and gate electrode 16. Gate dielectric 14 preferably includes commonly used dielectric materials such as oxides, nitrides, oxynitrides, high-k materials, and combinations thereof. Gate electrode 16 may be formed of polysilicon, and impurities may be doped to improve its conductivity as the deposition proceeds. Alternatively, gate electrode 16 is formed of other commonly used conductive materials such as metals, metal silicides, metal nitrides, and combinations thereof. As is known in the art, gate dielectric 14 and gate electrode 16 may be formed by stacking a gate electrode layer on a gate dielectric layer, and then patterning the stacked layers.

An optional pre-amorphized implantation (PAI) is performed to reduce the dopant channeling effect and to enhance dopant activation. This step is preferably omitted if no implantation is performed in the subsequent formation of deep source/drain regions. In the preferred embodiment, silicon, germanium and/or carbon are implanted. In other embodiments, inert gases, such as neon, argon, krypton, xenon, and radon, are used. The PAI prevents subsequently doped impurities from channeling through spaces between the crystal lattice structure and reaching depths greater than desired. At least a top portion of the exposed portions of (single crystalline) substrate 2 is changed to an amorphous state as a result of the PAI.

Figure 2:
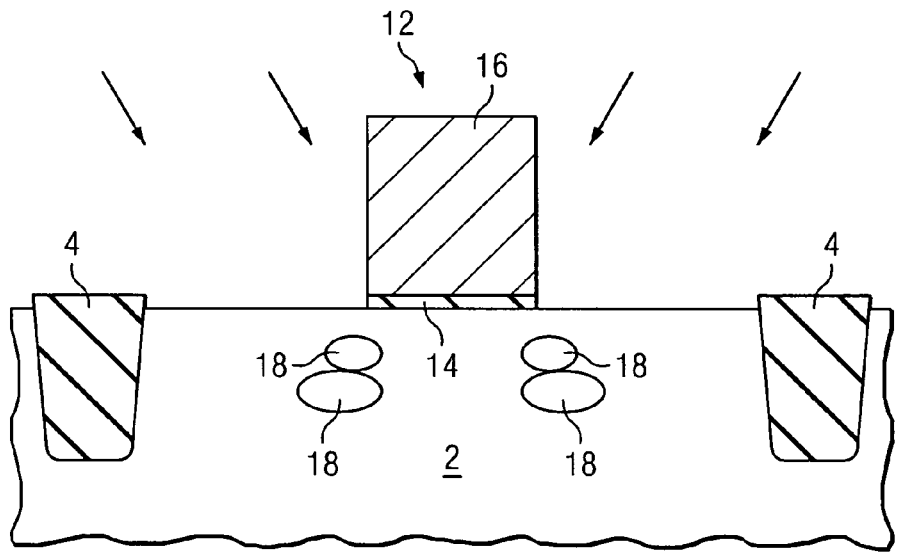

FIG. 2 illustrates the formation of pocket/halo regions 18, preferably by implantation (as symbolized by arrows). In the preferred embodiment, n-type impurities, preferably arsenic, are implanted. In other embodiments, phosphorous may be implanted. The implantation may be tilted. In the preferred embodiment, pocket/halo regions 18 are located around the side borders and junction of the subsequently formed lightly doped source/drain (LDD) regions and deep source/drain regions to neutralize lateral diffusion of the n-type impurities. Although pocket/halo regions 18 may also be formed in the subsequently formed source/drain regions (not shown), the effects of these portions of pocket/halo regions 18 are insignificant due to the high impurity concentration in source/drain regions. These portions of pocket/halo regions are thus not illustrated.

Figure 3:
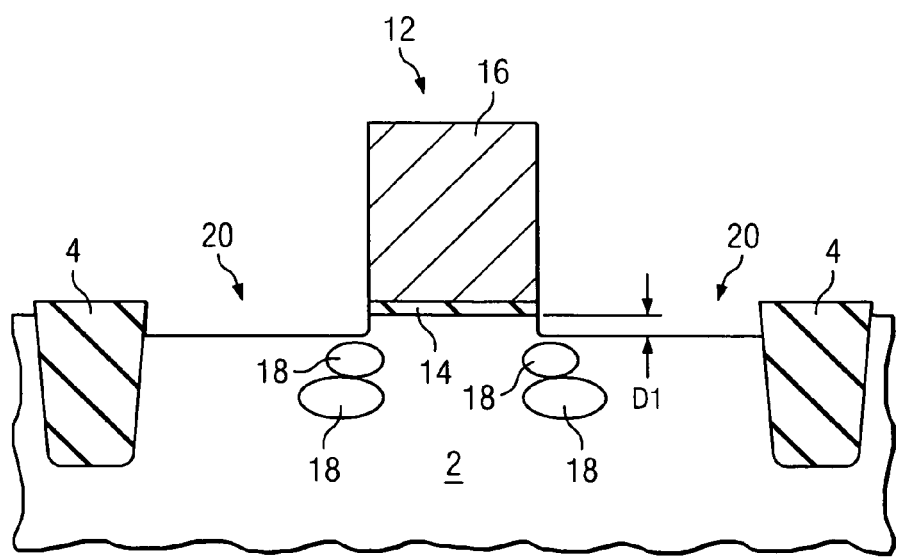

FIG. 3 illustrates the formation of recesses 20 in substrate 2, wherein recesses 20 are formed substantially along the edges of gate electrode 16, preferably by etching isotropically or anisotropically. Alternatively, thin spacers (not shown), which have the thickness of less than 200 Å, more preferably around 100 Å, may be formed to protect gate electrode 16 prior to the formation of recesses 20. The depth of recesses 20 is preferably substantially close to the desired depth of lightly doped source/drain regions. For example, depth D1 of recesses 20 may be between about 100 Å and about 500 Å, although depth D1 may be greater or smaller.

Figure 4A:
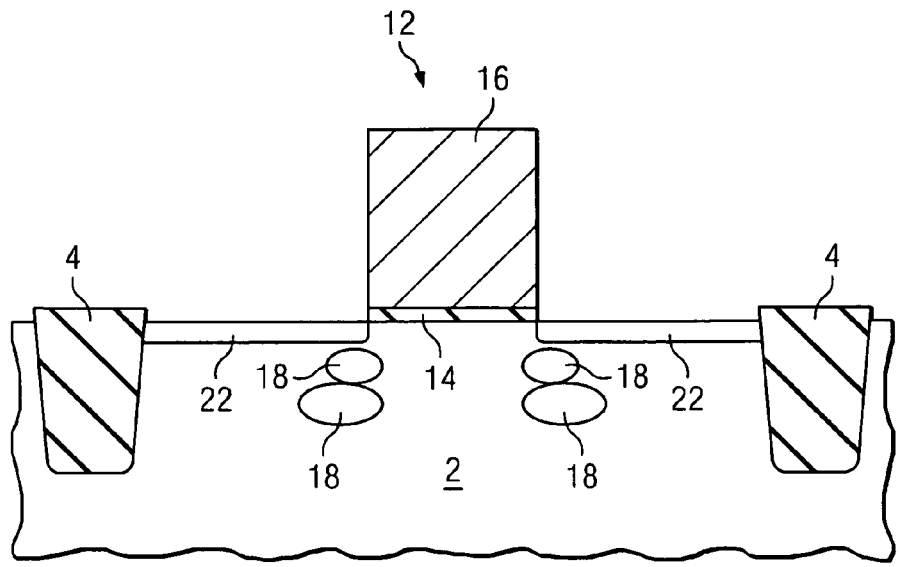

Recesses 20 are then filled to form carbon-doped regions 22, as illustrated in FIG. 4A, preferably by epitaxially growing silicon in the recesses 20 and simultaneously doping impurities. In the preferred embodiment, carbon and boron are doped when the epitaxial growth proceeds. Alternatively, other impurities such as indium may be doped along with carbon. Preferably, carbon is doped to a concentration of between about $1E19/cm^3$ and about $5E20/cm^3$, and the p-type impurities are doped to a concentration of between about $1E19/cm^3$ and about $5E20/cm^3$. In the preferred embodiment, carbon-doped regions 22 have a top surface substantial level with a top surface of substrate 2. In other embodiments, the top surface of carbon-doped regions 22 may be higher or lower than the top surface of substrate 2.

Figure 4B:
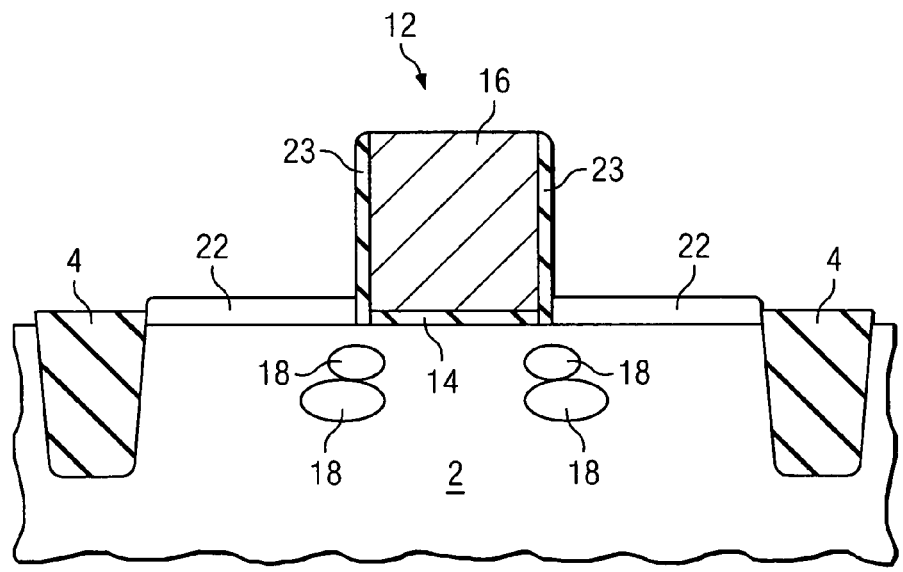

FIG. 4B illustrates an alternative embodiment of the present invention. In this embodiment, no recesses are formed, and the carbon-doped regions 22 are formed on the top surface of substrate 2, preferably by an epitaxy method. Similarly, the raised carbon-doped regions 22 have a thickness substantially close to the desired depth of lightly doped source/drain regions. In this embodiment, thin spacers 23 may need to be formed prior to the epitaxy process.

Figure 5:
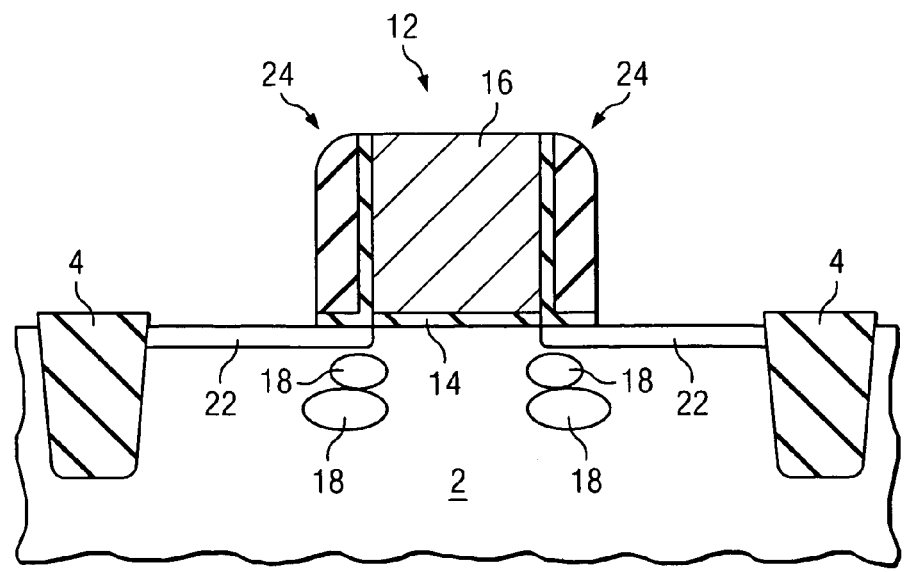

FIG. 5 illustrates the formation of gate spacers 24. As is known in the art, gate spacers 24 may be formed by blanket depositing gate spacer layer(s), and then removing the horizontal portions of the gate spacer layer(s). The deposition may be performed using commonly used techniques, such as plasma enhanced chemical vapor deposition (PECVD), low-pressure chemical vapor deposition (LPCVD), sub-atmospheric chemical vapor deposition (SACVD), and the like. The patterning may be performed by either wet etching or dry etching. In the preferred embodiment, gate spacers 24 include liner oxide portions and overlying nitride portions. In alternative embodiments, gate spacers 24 includes one or more layers, each comprising oxide, silicon nitride, silicon oxynitride (SiON), and/or other dielectric materials.

Figure 6:
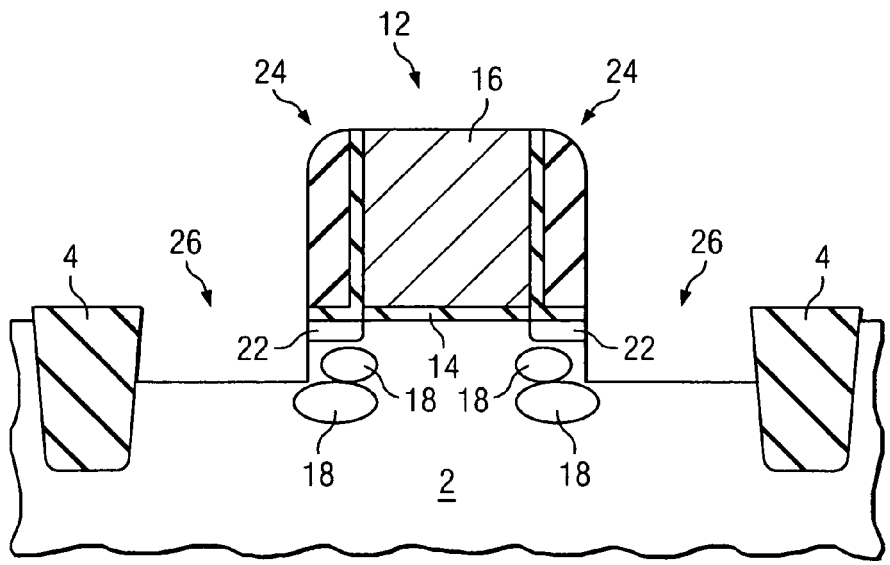

Referring to FIG. 6, recesses 26 are formed along the edges of gate spacers 24, preferably by etching isotropically or anisotropically. The depth of recesses 26 is preferably greater than the depth of recesses 20 (refer to FIG. 3). In an exemplary embodiment, the depth of recesses 26 is between about 500 Å and about 1000 Å, or even between about 700 Å and 900 Å. It is appreciated, however, that the dimensions recited throughout the description will scale accordingly with the scaling of the technology used in forming the integrated circuits.

Figure 7:
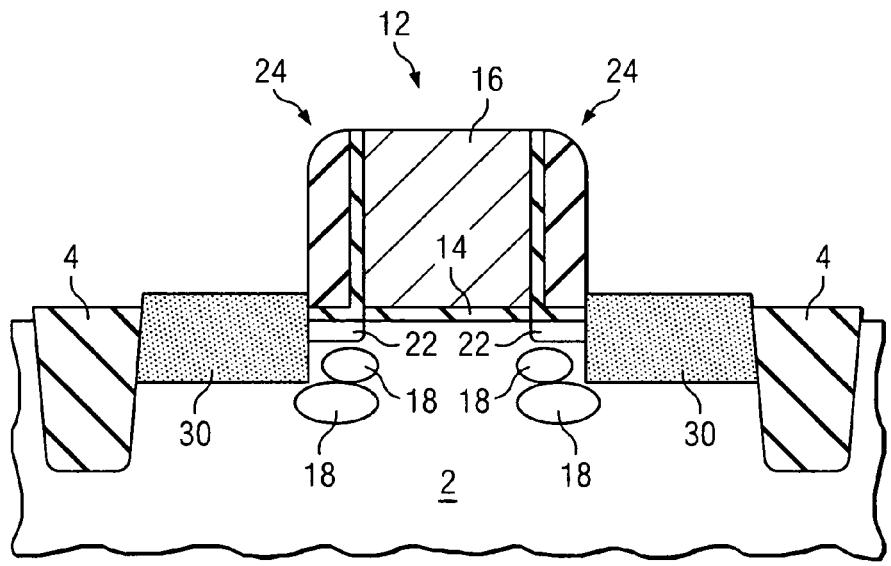

FIG. 7 illustrates the formation of epitaxy regions, often referred to as SiGe stressors. SiGe stressors 30 are epitaxially grown in recesses 26 by selective epitaxial growth (SEG). SiGe stressors 30 preferably have a lattice spacing greater than the lattice spacing of substrate 2. In an exemplary embodiment, SiGe stressors 30 are formed using chemical vapor deposition (CVD) in a chamber, in which the chamber pressure is preferably between about 5 torr and about 20 torr. The preferred temperature is between about 550° C. and about 800° C. The precursors include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. In the preferred embodiment, the resulting SiGe stressors 30 include between about 20 atomic percent and about 40 atomic percent germanium. In the preferred embodiment, SiGe stressors 30 have a top surface substantially higher than the top surface of substrate 2. In other embodiments, the top surface of SiGe stressors 30 is substantially level with the top surface of substrate 2. In the preferred embodiment, a p-type impurity, such as boron and/or indium, is introduced while the epitaxy proceeds, and thus SiGe stressors 30 form the deep source/drain regions of the resulting PMOS devices. After the formation of SiGe stressors 30, an additional implantation may be performed to further introduce p-type impurities. In alternative embodiments, no recesses are formed, and the deep source/drain regions are formed by implantation only.

Figure 8A:
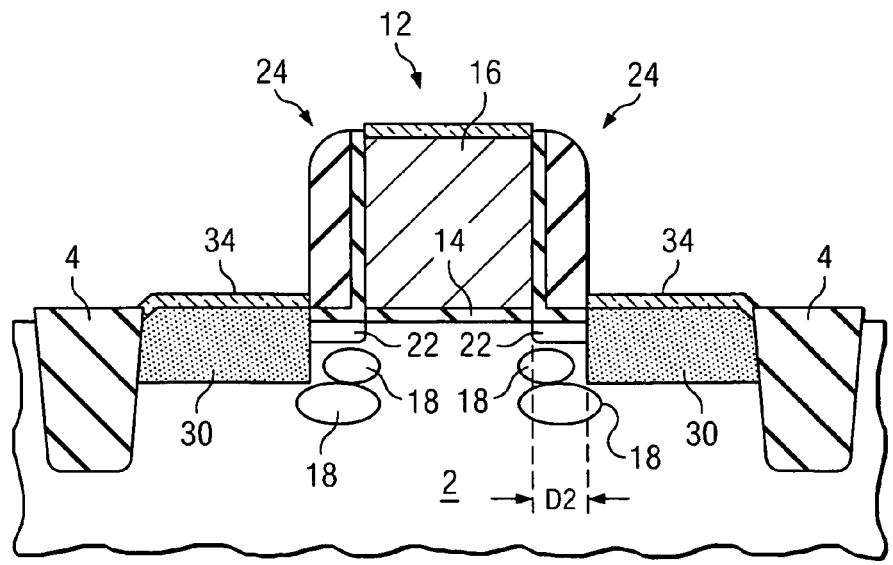

FIG. 8A illustrates the formation of germano-silicide regions 34, which preferably have a thickness of between about 50 Å and about 300 Å. Throughout the description, germano-silicide regions 34 are also referred to as silicide regions 34. As is known in the art, germano-silicide regions 34 are preferably formed by blanket depositing a thin layer of metal, such as nickel, platinum, palladium, vanadium, titanium, cobalt, tantalum, ytterbium, zirconium, and combinations thereof. The substrate is then heated, causing silicon and germanium to react with the metal where contacted. After the reaction, a layer of metal silicide and/or metal germano-silicide is formed between the silicon/germanium and metal. The un-reacted metal is selectively removed through the use of an etchant that attacks metal but does not attack silicide and germano-silicide.

Figure 8B:
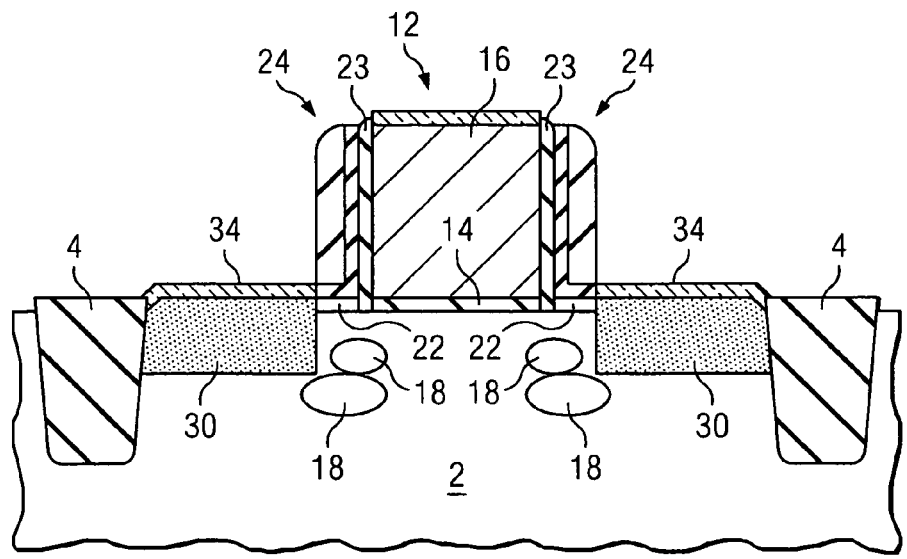
FIG. 8B illustrates a PMOS embodiment, wherein LDD regions are formed on a semiconductor substrate.

FIG. 8B illustrates an alternative embodiment, which is formed based on the structure shown in FIG. 4B, wherein carbon-doped regions 22 are raised on substrate 2. One skilled in the art will realize the corresponding procedural steps.

Figure 9:
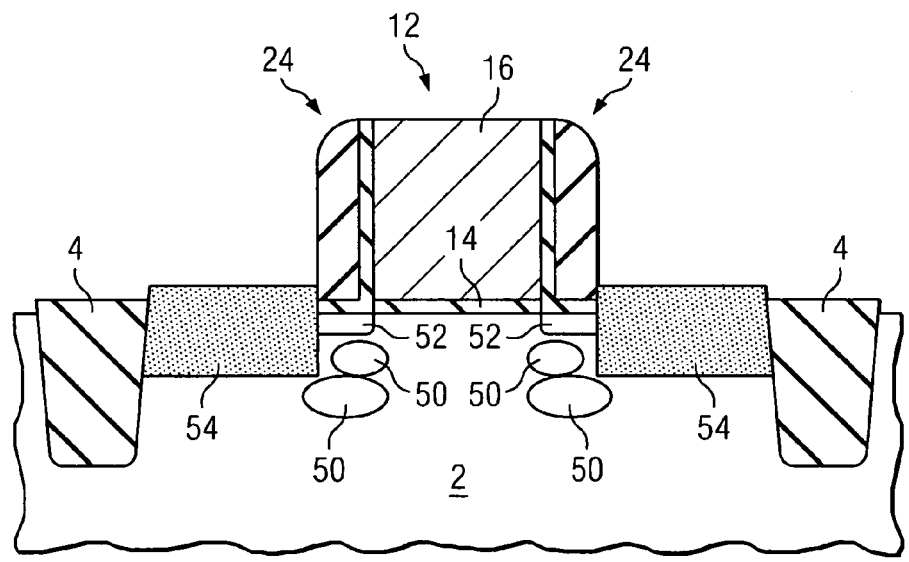
FIG. 9 illustrates an NMOS embodiment.

FIG. 9 illustrates an NMOS embodiment. Similar to the embodiment shown in FIGS. 8A and 8B, the NMOS embodiment may include stressors that have smaller lattice constant than substrate 2, which includes SiC. The formation process of the NMOS device is similar to the formation of the PMOS embodiment, except that the impurity types are reversed. The formation processes preferably include forming doped regions 52, which may include forming recesses in substrate 2, and epitaxially growing a semiconductor material, carbon and an n-type impurity in the recesses. Alternatively, doped regions 52 are formed on substrate 2. Pocket/halo regions 50 are formed by implanting p-type impurities such as boron, $BF_2$ and/or indium. Gate spacers 24 are then formed, followed by the formation of stressors 54, which may include the doping of n-type impurities such as phosphorous. After the formation of stressors 54, n-type impurities may be further implanted. Alternatively, stressors 54 are not formed, and the source/drain regions are formed by implanting n-type impurities.

The embodiments of the present invention have several advantageous features. Since the LDD regions are formed by epitaxy instead of implantation, very shallow LDD regions may be formed. Carbon has the function of retarding the diffusion of p-type and n-type impurities. The doping of carbon into LDD regions reduces the diffusion of impurities into LDD regions. Therefore, the resulting LDD regions are shallow. In addition, doping carbon retards the lateral diffusion of impurities into channel regions, and thus short channel characteristics are improved. Without the necessity of performing implantation for the formation of LDD regions and source/drain regions, the LDD regions and source/drain regions are free from the damage caused by the implantation. This in turn reduces the leakage current into the substrate.

Referring back to FIG. 8A, with less diffusion from carbon-doped regions 22, SiGe stressors 30 can be formed closer to the channel region without causing too much diffusion of impurities into the channel region. In the preferred embodiment, the distance D2 between SiGe stressors 30 and the respective edge of gate electrode 16 is less than about 25 nm, and more preferably between about 10 nm and about 25 nm. With a smaller distance D2, the stress applied to the channel region is increased, and thus drive current is increased. Such a small distance D2 is made possible due to the co-doping of carbon, which results in reduced diffusion of impurities into the channel region.

Figure 10:
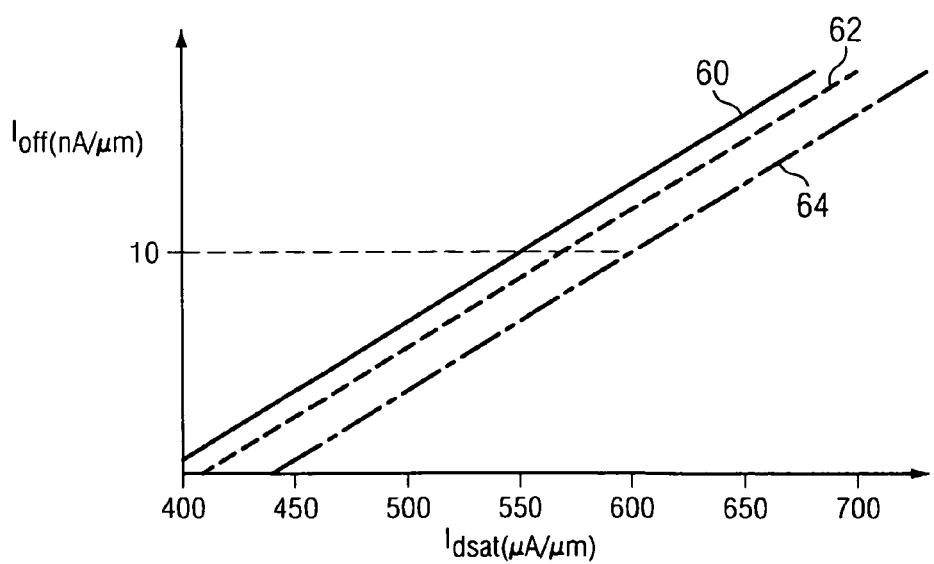
FIG. 10 illustrates the effects of present invention, wherein leakage currents are illustrated as a function of drive currents.

FIG. 10 illustrates experiment results obtained from three sample MOS devices, wherein leakage currents $I_{off}$ are illustrated as a function of drive currents $I_{dsat}$. The results of a first sample device are illustrated as line 60, wherein the first sample device does not include carbon in the LDD regions. The second and the third sample devices are embodiments of the present invention, wherein carbon is doped in the LDD regions as shown in FIG. 8A. The difference between the second and the third sample devices is that the lateral distance D2 (refer to FIG. 8A) in the third sample device is smaller than in the second sample device by 3 nm. The results of the second and third sample devices are illustrated as lines 62 and 64 respectively. At a leakage current of about 10 nA/μm, the drive currents of the first, second and third sample devices are 589 μA/μm, 551 μA/μm and 530 μA/μm, respectively.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
    providing a semiconductor substrate;
    forming a gate stack on the semiconductor substrate;
    forming a first recess in the semiconductor substrate and adjacent the gate stack;
    epitaxially growing a lightly-doped source/drain (LDD) region in the first recess, and simultaneously doping carbon and a first impurity in the LDD region;
    forming a gate spacer on a sidewall of the gate stack;
    forming a second recess along a sidewall of the gate spacer, wherein the second recess is spaced apart from an edge of the gate stack further than the first recess; and
    epitaxially growing a semiconductor material in the second recess, and simultaneously doping a second impurity of a same conductivity type as the first impurity in the semiconductor material.

2. The method of claim 1, wherein the LDD region is free from implantation steps for implanting an impurity of a same conductivity type as the first and the second impurities.

3. The method of claim 1, wherein the first and the second impurities are of p-type, and wherein the semiconductor material comprises SiGe.

4. The method of claim 1, wherein the first and the second impurities are of n-type, and wherein the semiconductor material comprises SiC.

5. The method of claim 1 further comprising implanting an impurity of a same conductivity type as the first and the second impurities into the semiconductor material.

6. The method of claim 1, wherein the first recess is formed substantially aligned with a sidewall of the gate stack.

7. The method of claim 1 further comprising forming a thin spacer having a thickness of less than about 200 Å before the step of forming the first recess so that the first recess is substantially aligned with an edge of the thin spacer, and removing the thin spacer after the step of forming the first recess.

8. A method of forming a semiconductor structure, the method comprising:
    providing a semiconductor substrate;
    forming a gate stack on the semiconductor substrate;

epitaxially growing a lightly-doped source/drain (LDD) region on the semiconductor substrate adjacent the gate stack, wherein carbon and a first impurity are doped simultaneously with the step of epitaxially growing the LDD region;

after the step of epitaxially growing the LDD region, forming a gate spacer on a sidewall of the gate stack;

after the step of forming the gate spacer, forming a recess along a sidewall of the gate spacer; and epitaxially growing a semiconductor material in the recess, wherein a second impurity of a same conductivity type as the first impurity is doped with epitaxial growth.

9. The method of claim 8, wherein the LDD region is free from implantation steps for implanting an impurity of a same conductivity type as the first and the second impurities.

10. The method of claim 8, wherein a bottom surface of the LDD region is substantially leveled with an interface between the semiconductor substrate and the gate stack.

* * * * *